United States Patent
Byeon

(10) Patent No.: US 10,373,658 B2
(45) Date of Patent: Aug. 6, 2019

(54) SEMICONDUCTOR MODULES

(71) Applicant: SK hynix Inc., Icheon-si, Gyeonggi-do (KR)

(72) Inventor: Sang Jin Byeon, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 36 days.

(21) Appl. No.: 15/638,906

(22) Filed: Jun. 30, 2017

(65) Prior Publication Data
US 2019/0005992 A1    Jan. 3, 2019

(51) Int. Cl.
| | | |
|---|---|---|
| G11C 7/10 | (2006.01) |
| G11C 8/04 | (2006.01) |
| H01L 31/0203 | (2014.01) |
| H05K 1/14 | (2006.01) |
| G11C 5/04 | (2006.01) |
| G11C 8/12 | (2006.01) |
| G11C 11/00 | (2006.01) |

(52) U.S. Cl.
CPC .............. *G11C 7/1012* (2013.01); *G11C 5/04* (2013.01); *G11C 7/1066* (2013.01); *G11C 7/1069* (2013.01); *G11C 8/04* (2013.01); *G11C 8/12* (2013.01); *G11C 11/005* (2013.01); *H01L 31/0203* (2013.01); *H05K 1/14* (2013.01); *G11C 2207/005* (2013.01)

(58) Field of Classification Search
CPC ... G11C 7/1012; G11C 7/1069; G11C 7/1066; G11C 8/04; H05K 1/14; H01L 31/0203
USPC .......................................................... 257/138
See application file for complete search history.

(56) References Cited

U.S. PATENT DOCUMENTS

| | | | | |
|---|---|---|---|---|
| 7,567,483 B2 * | 7/2009 | Kim ..................... | G11C 7/1066 |
| | | | 365/189.07 |
| 9,460,791 B1 * | 10/2016 | Shallal .................... | G11C 7/08 |
| 2006/0036826 A1 | 2/2006 | Dell et al. | |
| 2013/0077382 A1 * | 3/2013 | Cho ......................... | G11C 7/10 |
| | | | 365/148 |
| 2013/0332667 A1 * | 12/2013 | Uchigaito ............ | G11C 7/1072 |
| | | | 711/105 |
| 2015/0363107 A1 * | 12/2015 | Best ......................... | G11C 5/04 |
| | | | 711/105 |
| 2016/0034371 A1 * | 2/2016 | Oh ......................... | G06F 3/0619 |
| | | | 714/6.2 |

FOREIGN PATENT DOCUMENTS

KR    1020130107841 A    10/2013

* cited by examiner

*Primary Examiner* — Fernando L Toledo
*Assistant Examiner* — Adam S Bowen
(74) *Attorney, Agent, or Firm* — William Park & Associates Ltd.

(57) ABSTRACT

A semiconductor module may include a host, a first semiconductor device, and a second semiconductor device. The first host line may be connected to the first and second semiconductor device or devices, according to a set mode.

20 Claims, 13 Drawing Sheets

FIG. 7

|  | SC<1> | SC<2> | SC<3> | SC<4> | SC<5> | SC<6> | SC<7> | SC<8> |
|---|---|---|---|---|---|---|---|---|
| FIRST SET MODE | H | H | H | L | H | H | H | L |
| SECOND SET MODE | L | H | H | H | H | L | L | H |
| THIRD SET MODE | L | H | H | L | L | H | H | L |
|  | L | H | H | H | H | L | L | H |

FIG. 8

| | SC<9> | SC<10> | SC<11> | SC<12> | SC<13> | SC<14> | SC<15> | SC<16> |
|---|---|---|---|---|---|---|---|---|
| FIRST SET MODE | H | H | H | L | H | H | H | L |
| SECOND SET MODE | L | L | L | H | L | H | H | H |
| THIRD SET MODE | L | L | L | H | L | L | H | H |
| | L | L | L | H | L | H | H | H |

SEMICONDUCTOR MODULES

BACKGROUND

1. Technical Field

Embodiments of the present disclosure may generally relate to semiconductor modules configured to control interconnections between semiconductor devices.

2. Related Art

In general, a semiconductor module including a module board and a plurality of memory chips mounted on the module board is employed as a memory for data storage in data processing systems such as personal computers, workstations, server computers or communication systems.

Memory chips employed in most of semiconductor modules used in the data processing systems may include volatile memory chips such as dynamic random access memory (DRAM) chips. However, the volatile memory chips may lose stored data when power supplies of the volatile memory chips are interrupted. Accordingly, semiconductor modules such as non-volatile dual in-line memory modules (NVDIMMs) have been proposed to overcome the disadvantage of the volatile memory chips. Each of the NVDIMMs corresponds to a semiconductor module including both of a volatile memory chip and a nonvolatile memory chip.

The semiconductor module may employ a point-to-point scheme or a multi-drop scheme according to an interconnection state between a host and memory chips. The point-to-point scheme means that a host is connected to a plurality of memory chips with a one-to-one correspondence. The multi-drop scheme means that a host is simultaneously connected to a plurality of memory chips.

SUMMARY

According to an embodiment, a semiconductor module may be provided. The semiconductor module may include a host, a first semiconductor device and a second semiconductor device. The host may include a first host line and a second host line. The first semiconductor device may include a first channel and a second channel. The second semiconductor device may include a third channel and a fourth channel. The first host line may be connected to the first and third channels or to the first and second channels, according to a set mode. The second host line may be connected to the second and fourth channels or to the third and fourth channels, according to the set mode.

According to an embodiment, a semiconductor module may include a host, a first semiconductor device and a second semiconductor device. The host may include a first host line and a second host line. The first semiconductor device may include a plurality of channels. The second semiconductor device may include a plurality of channels. If a set mode is a first set mode, the first and second host lines may be connected to the plurality of channels included in one semiconductor device having a faster operation speed out of the first and second semiconductor devices to receive or output a signal, and thereafter one of the first and second host lines may be connected to the plurality of channels included in the other semiconductor device having a slower operation speed out of the first and second semiconductor devices to receive or output a signal.

According to an embodiment, a semiconductor module may include a host, a first semiconductor device and a second semiconductor device. Based on a set mode, the host may be connected to the first semiconductor device through the first host line and the second semiconductor device through the second host line by a one-to-one correspondence with a point-to-point scheme or the host may be simultaneously connected to the first semiconductor device and the second semiconductor device through both the first host line and the second host line with a multi-drop scheme.

According to an embodiment, wherein the first semiconductor device includes a first channel and a second channel, wherein the second semiconductor device includes a third channel and a fourth channel, wherein the first host line is connected to the first and second channels of the first semiconductor device and the second host line is connected to the third and fourth channels of the second semiconductor device with the point-to-point scheme, and wherein the first host line is simultaneously connected to the first and third channels of the first and second semiconductor devices, respectively, and the second host line is simultaneously connected to the second and fourth channels of the first and second semiconductor devices, respectively, with the multi-drop scheme.

According to an embodiment, a semiconductor module may include a host, a first semiconductor device and a second semiconductor device. The host may be configured to include a first host line and a second host line. The first semiconductor device may be configured to operate with a first operation speed. The second semiconductor device may be configured to operate with a second operation speed different from the first operation speed. Based on the operation speeds, the host may be connected to one semiconductor device of the first or second semiconductor devices through the first host line and the second host line by a one-to-one correspondence with a point-to-point scheme, and thereafter the host may be connected to the first semiconductor device through the first host line and the second semiconductor device through the second host line with a multi-drop scheme.

According to an embodiment, wherein if the first operation speed is greater than the second operation speed then the host is connected to the first semiconductor device through the first host line and the second host line by the one-to-one correspondence with the point-to-point scheme, and wherein if the second operation speed is greater than the first operation speed then the host is connected to the second semiconductor device through the first host line and the second host line by the one-to-one correspondence with the point-to-point scheme.

According to an embodiment, wherein the first semiconductor device includes a first channel and a second channel, wherein the second semiconductor device includes a third channel and a fourth channel, wherein if the first operation speed is greater than the second operation speed then the first host line is connected to the first channel and the second host line is connected to the second channel with the point-to-point scheme, and thereafter the host is connected to the first and second channels of the first semiconductor device and the second host line is connected to the third and fourth channels of the second semiconductor device with the multi-drop scheme, and wherein if the second operation speed is greater than the first operation speed then the first host line is connected to the third channel and the second host line is connected to the fourth channel with the point-to-point scheme, and thereafter the host is connected to the first and second channels of the first semiconductor device and the second host line is connected to the third and fourth channels of the second semiconductor device with the multi-drop scheme.

BRIEF DESCRIPTION OF THE DRAWINGS

FIGS. 7 and 8 are tables illustrating various logic levels of a switch control signal according to set modes used in an embodiment of the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure. Further, the logic levels of the signals may be different from or the opposite of those described. For example, a signal described as having a logic "high" level may alternatively have a logic "low" level, and a signal described as having a logic "low" level may alternatively have a logic "high" level. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

Various embodiments may be directed to semiconductor modules controlling interconnections between channels included in a plurality of semiconductor devices.

Figure 1:
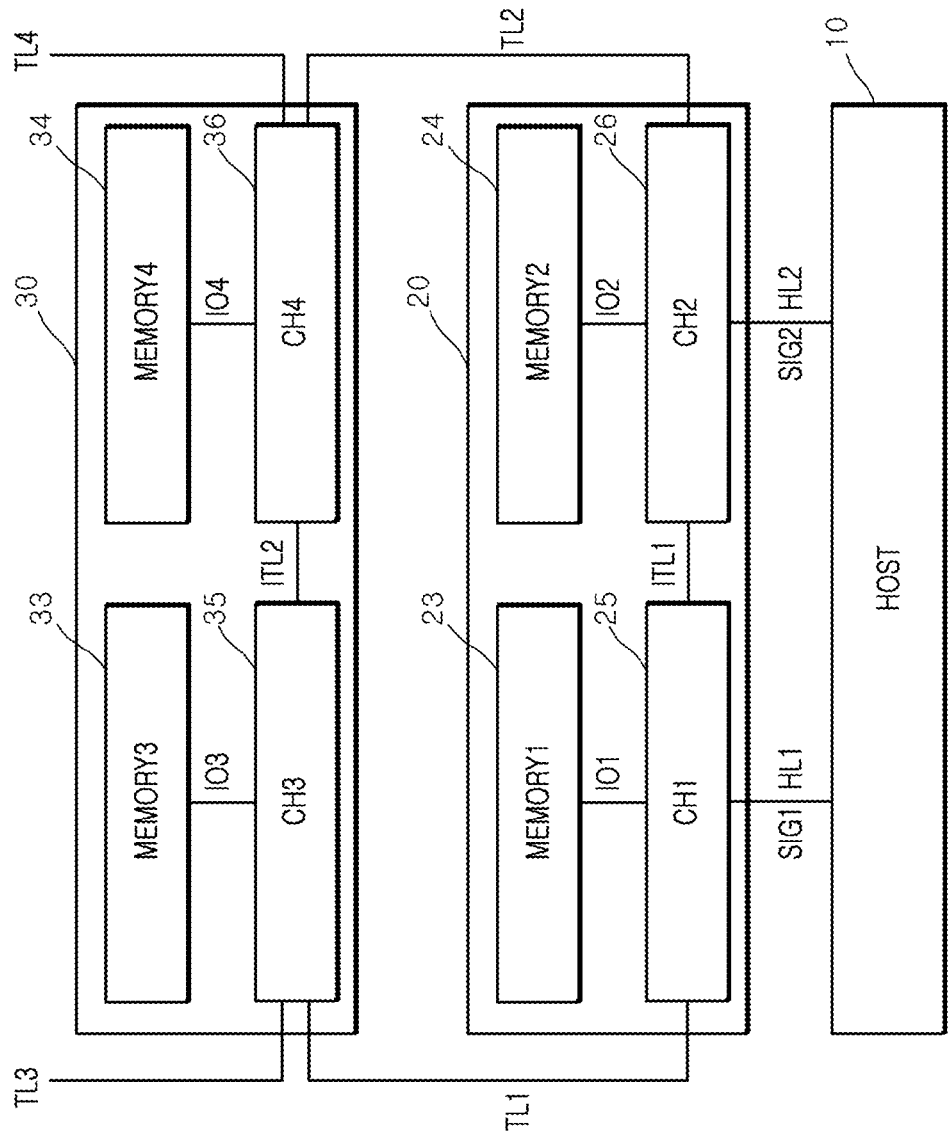
FIG. 1 is a block diagram illustrating a configuration of a semiconductor module according to an embodiment of the present disclosure.

Referring to FIG. 1, a semiconductor module according to an embodiment may include a host 10, a first semiconductor device 20 and a second semiconductor device 30. The host 10, the first semiconductor device 20 and the second semiconductor device 30 may be mounted on a single module board. The first and second semiconductor devices 20 and 30 may be realized using volatile memory devices or nonvolatile memory devices according to the embodiments. The first and second semiconductor devices 20 and 30 may be realized using volatile memory devices that have the same function and the same operation speed (e.g., the same access time) according to the embodiments. Alternatively, one of the first and second semiconductor devices 20 and 30 may be realized using a volatile memory device, and the other of the first and second semiconductor devices 20 and 30 may be realized using a nonvolatile memory device. In such a case, the first and second semiconductor devices 20 and 30 may have different operation speeds.

The host 10 may receive or output a first signal SIG1 through a first host line HL1. The host 10 may receive or output a second signal SIG2 through a second host line HL2. The number of host lines included in the host 10 may be set to be different according to the embodiments. Each of the first and second signals SIG1 and SIG2 may be set to be any one of various signals such as a command, an address, a clock signal and data according to the embodiments. Although each of the first and second signals SIG1 and SIG2 is illustrated as a single line in FIG. 1, at least one of the first and second signals SIG1 and SIG2 may be set to have a plurality of bits according to the embodiments.

The first semiconductor device 20 may include a first memory circuit 23, a second memory circuit 24, a first channel 25 and a second channel 26.

The first memory circuit 23 may receive or output signals through a first input and output (I/O) line IO1. The second memory circuit 24 may receive or output signals through a second input and output (I/O) line IO2. In a first set mode, the first channel 25 may connect the first host line HL1 to a first transmission line TL1 or the first input and output (I/O) line IO1 to receive or output the first signal SIG1. In the first set mode, the second channel 26 may connect the second host line HL2 to a second transmission line TL2 or the second input and output (I/O) line IO2 to receive or output the second signal SIG2. In a second set mode, the first and second channels 25 and 26 may connect the first input and output (I/O) line IO1 to the second input and output (I/O) line IO2 through a first internal transmission line ITL1. In the second set mode, the first channel 25 may connect the first and second input and output (I/O) lines IO1 and IO2 to the first host line HL1 and may receive or output the first signal SIG1 through the first host line HL1. In the second set mode, the second channel 26 may connect the second transmission line TL2 to the second host line HL2 and may receive or output the second signal SIG2 through the second host line HL2. In a third set mode, after the first channel 25 connects the first input and output (I/O) line IO1 to the first host line HL1 to receive or output the first signal SIG1 through the first host line HL1, the first channel 25 may connect the first and second input and output (I/O) lines IO1 and IO2 to the first host line HL1 to receive or output the first signal SIG1 through the first host line HL1. In the third set mode, after the second channel 26 connects the second input and output (I/O) line IO2 to the second host line HL2 to receive or output the second signal SIG2 through the second host line HL2, the second channel 26 may connect the second transmission line TL2 to the second host line HL2 to receive or output the second signal SIG2 through the second host line HL2. The first set mode means that the first and second semiconductor devices 20 and 30 are realized using volatile memory devices having the same function and are realized to use a multi-drop scheme. The second set mode means that the first and second semiconductor devices 20 and 30 are realized using volatile memory devices having the same function and are realized to use a point-to-point scheme. The third set mode means that the first and second semiconductor devices 20 and 30 are respectively realized using a volatile memory device and a nonvolatile memory device and are realized to sequentially use a point-to-point scheme and a multi-drop scheme.

In the first set mode, the first semiconductor device 20 may connect the first host line HL1 to the first channel 25. In the first set mode, the first semiconductor device 20 may connect the first host line HL1 to the first transmission line TL1 or the first input and output (I/O) line IO1. In the first set mode, the first semiconductor device 20 may connect the second host line HL2 to the second channel 26. In the first set mode, the first semiconductor device 20 may connect the second host line HL2 to the second transmission line TL2 or the second input and output (I/O) line IO2. In the second set mode, the first semiconductor device 20 may connect the first host line HL1 to the first and second channels 25 and 26. In the second set mode, the first semiconductor device 20 may connect the first host line HL1 to the first and second input and output (I/O) lines IO1 and IO2. In the second set mode, the first semiconductor device 20 may connect the second host line HL2 to the second transmission line TL2. If the first semiconductor device 20 is in the third set mode, the first host line HL1 may be connected to the first and second channels 25 and 26 and the second host line HL2 may be connected to the third and fourth channels 35 and 36 after the first host line HL1 is connected to the first channel 25 and the second host line HL2 is connected to the second channel 26. If the first semiconductor device 20 is in the third set mode, the first host line HL1 may be connected to the first and second input and output (I/O) lines IO1 and IO2 after the first host line HL1 is connected to the first input and output (I/O) line IO1. If the first semiconductor device 20 is in the third set mode, the second host line HL2 may be connected to the second transmission line TL2 after the second host line HL2 is connected to the second input and output (I/O) line IO2.

The second semiconductor device 30 may include a third memory circuit 33, a fourth memory circuit 34, a third channel 35 and a fourth channel 36.

The third memory circuit 33 may receive or output signals through a third input and output (I/O) line IO3. The fourth memory circuit 34 may receive or output signals through a fourth input and output (I/O) line IO4. In the first set mode, the third channel 35 may connect the first transmission line TL1 to a third transmission line TL3 or the third input and output (I/O) line IO3 to receive or output signals. In the first set mode, the fourth channel 36 may connect the second transmission line TL2 to a fourth transmission line TL4 or the fourth input and output (I/O) line IO4 to receive or output signals. In the second set mode, the third and fourth channels 35 and 36 may connect the third input and output (I/O) line IO3 to the fourth input and output (I/O) line IO4 through a second internal transmission line ITL2. In the second set mode, the third channel 35 may connect the third input and output (I/O) line IO3 to the fourth input and output (I/O) line IO4. In the second set mode, the fourth channel 36 may connect the fourth input and output (I/O) line IO4 to the second transmission line TL2 to receive or output signals. In the third set mode, the third channel 35 may connect the third input and output (I/O) line IO3 to the fourth input and output (I/O) line IO4. In the third set mode, the fourth channel 36 may connect the fourth input and output (I/O) line IO4 to the second transmission line TL2 to receive or output signals.

In the first set mode, the second semiconductor device 30 may connect the first transmission line TL1 to the third channel 35. In the first set mode, the second semiconductor device 30 may connect the first transmission line TL1 to the third transmission line TL3 or the third input and output (I/O) line IO3. In the first set mode, the second semiconductor device 30 may connect the first transmission line TL1 to the fourth channel 36. In the first set mode, the second semiconductor device 30 may connect the second transmission line TL2 to the fourth transmission line TL4 or the fourth input and output (I/O) line IO4. In the second set mode, the second semiconductor device 30 may connect the second transmission line TL2 to the third and fourth channels 35 and 36. In the second set mode, the second semiconductor device 30 may connect the second transmission line TL2 to the third and fourth input and output (I/O) lines IO3 and IO4. If the second semiconductor device 30 is in the third set mode, the second transmission line TL2 may be connected to the third and fourth channels 35 and 36. If the second semiconductor device 30 is in the third set mode, the third input and output (I/O) line IO3 may be connected to the fourth input and output (I/O) line IO4. If the second semiconductor device 30 is in the third set mode, the third and fourth input and output (I/O) lines IO3 and IO4 may be connected to the second transmission line TL2.

Figure 2:
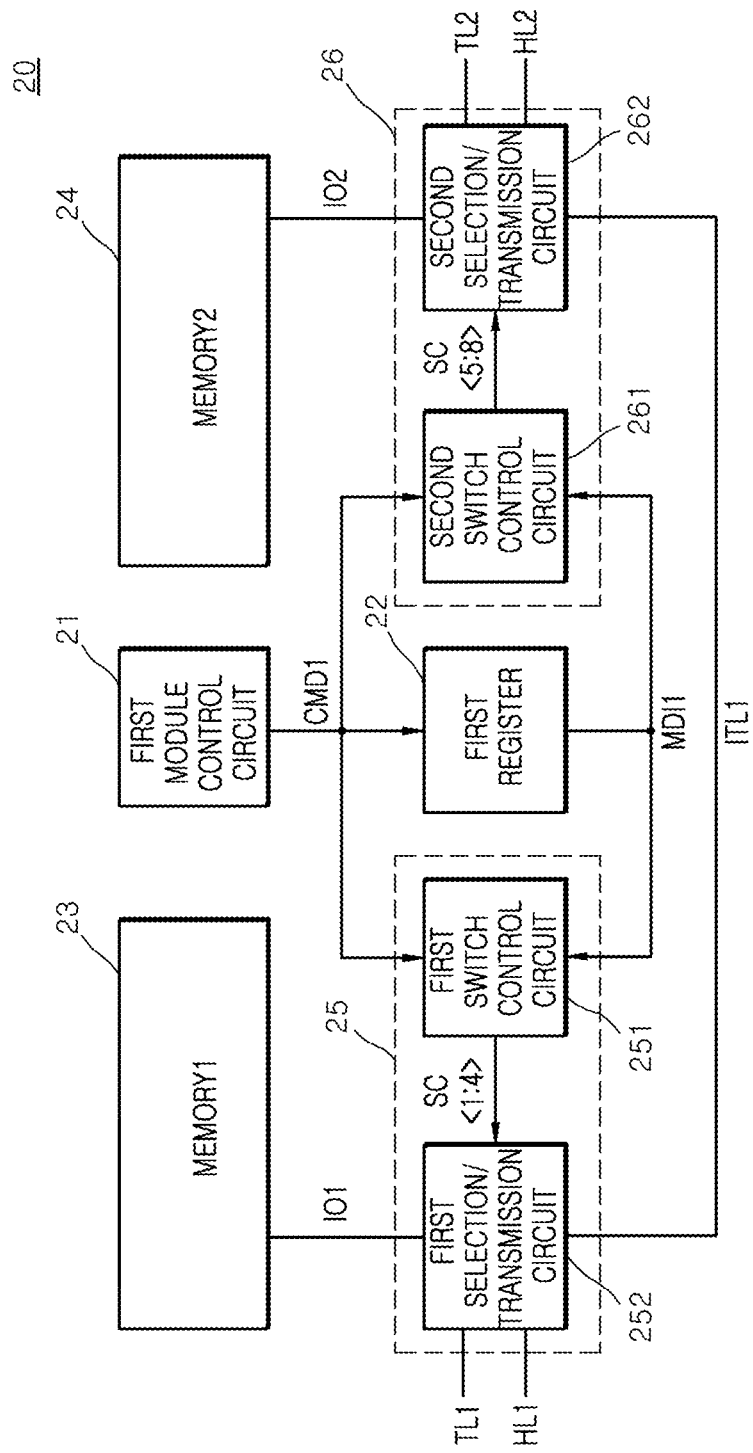
FIG. 2 is a block diagram illustrating a configuration of a first semiconductor device included in the semiconductor module of FIG. 1.

A configuration of the first semiconductor device 20 will be described hereinafter with reference to FIG. 2.

The first semiconductor device 20 may include a first module control circuit 21, a first register 22, the first memory circuit 23, the second memory circuit 24, the first channel 25 and the second channel 26. The first channel 25 may include a first switch control circuit 251 and a first selection/transmission circuit 252. The second channel 26 may include a second switch control circuit 261 and a second selection/transmission circuit 262.

The first module control circuit 21 may output a first command CMD1. The first command CMD1 may be set to be a command or a signal for controlling an operation of the first semiconductor device 20.

The first register 22 may output a first module information signal MDI1 including information on a set mode. The first module information signal MDI1 may include information on the first set mode, the second set mode and the third set mode. The first module information signal MDI1 may include a plurality of bits to have the information on the first set mode, the second set mode and the third set mode. In the first set mode, the first module information signal MDI1 may include information on an operation speed of the first semiconductor device 20.

The first switch control circuit 251 may generate first to fourth switch control signals SC<1:4> which are selectively enabled according to the first module information signal MDI1, in response to the first command CMD1. Logic levels of the first to fourth switch control signals SC<1:4> that are enabled according to the first to third set modes which are set by the first module information signal MDI1 will be described with reference to FIG. 7 later.

The first selection/transmission circuit 252 may control connections between the first host line HL1, the first transmission line TL1, the first input and output (I/O) line IO1 and the first internal transmission line ITL1, in response to the first to fourth switch control signals SC<1:4>. An operation for connections between the first host line HL1, the first transmission line TL1, the first input and output (I/O) line IO1 and the first internal transmission line ITL1 according to logic levels of the first to fourth switch control signals SC<1:4> will be described with reference to FIGS. 9 to 12 later.

The second switch control circuit 261 may generate fifth to eighth switch control signals SC<5:8> which are selectively enabled according to the first module information signal MDI1, in response to the first command CMD1. Logic levels of the fifth to eighth switch control signals SC<5:8> that are enabled according to the first to third set modes which are set by the first module information signal MDI1 will be described with reference to FIG. 7 later.

The second selection/transmission circuit 262 may control connections between the second host line HL2, the second transmission line TL2, the second input and output (I/O) line IO2 and the first internal transmission line ITL1, in response to the fifth to eighth switch control signals SC<5:8>. An operation for connections between the second host line HL2, the second transmission line TL2, the second input and output (I/O) line IO2 and the first internal transmission line ITL1 according to logic levels of the fifth to eighth switch control signals SC<5:8> will be described with reference to FIGS. 9 to 12 later.

Figure 3:
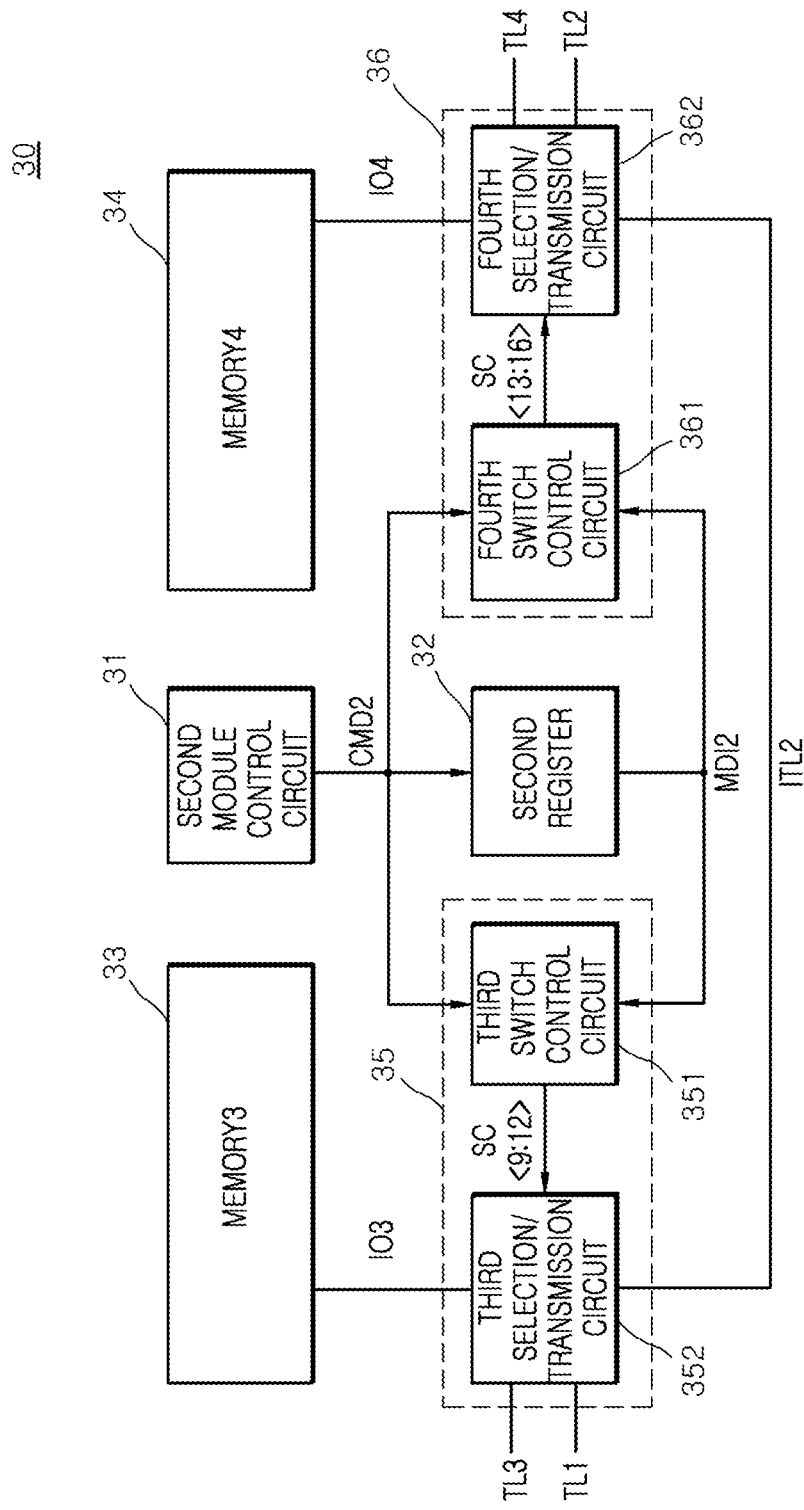
FIG. 3 is a block diagram illustrating a configuration of a second semiconductor device included in the semiconductor module of FIG. 1.

A configuration of the second semiconductor device 30 will be described hereinafter with reference to FIG. 3.

The second semiconductor device 30 may include a second module control circuit 31, a second register 32, the third memory circuit 33, the fourth memory circuit 34, the third channel 35 and the fourth channel 36. The third channel 35 may include a third switch control circuit 351 and a third selection/transmission circuit 352. The fourth channel 36 may include a fourth switch control circuit 361 and a fourth selection/transmission circuit 362.

The second module control circuit 31 may output a second command CMD2. The second command CMD2 may be set to be a command or a signal for controlling an operation of the second semiconductor device 30.

The second register 32 may output a second module information signal MDI2 including information on a set mode. The second module information signal MDI2 may include information on the first set mode, the second set mode and the third set mode. The second module information signal MDI2 may include a plurality of bits to have the information on the first set mode, the second set mode and the third set mode. In the third set mode, the second module information signal MDI2 may include information on an operation speed of the second semiconductor device 30.

The third switch control circuit 351 may generate ninth to twelfth switch control signals SC<9:12> which are selectively enabled according to the second module information signal MDI2, in response to the second command CMD2. Logic levels of the ninth to twelfth switch control signals SC<9:12> that are enabled according to the first to third set modes which are set by the second module information signal MDI2 will be described with reference to FIG. 8 later.

The third selection/transmission circuit 352 may control connections between the first transmission line TL1, the third transmission line TL3, the third input and output (I/O) line IO3 and the second internal transmission line ITL2, in response to the ninth to twelfth switch control signals SC<9:12>. An operation for connections between the first transmission line TL1, the third transmission line TL3, the third input and output (I/O) line IO3 and the second internal transmission line ITL2 according to logic levels of the ninth to twelfth switch control signals SC<9:12> will be described with reference to FIGS. 9 to 12 later.

The fourth switch control circuit 361 may generate thirteenth to sixteenth switch control signals SC<13:16> which are selectively enabled according to the second module information signal MDI2, in response to the second command CMD2. Logic levels of the thirteenth to sixteenth switch control signals SC<13:16> that are enabled according to the first to third set modes which are set by the second module information signal MDI2 will be described with reference to FIG. 8 later.

The fourth selection/transmission circuit 362 may control connections between the second transmission line TL2, the fourth transmission line TL4, the fourth input and output (I/O) line IO4 and the second internal transmission line ITL2, in response to the thirteenth to sixteenth switch control signals SC<13:16>. An operation for connections between the second transmission line TL2, the fourth transmission line TL4, the fourth input and output (I/O) line IO4 and the second internal transmission line ITL2 according to logic levels of the thirteenth to sixteenth switch control signals SC<13:16> will be described with reference to FIGS. 9 to 12 later.

Configurations of the first to fourth selection/transmission circuits 252, 262, 352 and 362 as well as connections between first to fourth selection/transmission circuits 252, 262, 352 and 362 will be described hereinafter with reference to FIG. 4.

The first selection/transmission circuit 252 may include a first switch circuit SW1, a second switch circuit SW2, a third switch circuit SW3 and a fourth switch circuit SW4.

The first switch circuit SW1 may connect the first host line HL1 to the first transmission line TL1 if the first switch control signal SC<1> is enabled. The second switch circuit SW2 may connect the first host line HL1 to a first internal line IL1 if the second switch control signal SC<2> is enabled. The third switch circuit SW3 may connect the first internal line IL1 to the first input and output (I/O) line IO1 if the third switch control signal SC<3> is enabled. The fourth switch circuit SW4 may connect the first input and output (I/O) line IO1 to the first internal transmission line ITL1 if the fourth switch control signal SC<4> is enabled.

The second selection/transmission circuit 262 may include a fifth switch circuit SW5, a sixth switch circuit SW6, a seventh switch circuit SW7 and an eighth switch circuit SW8.

The fifth switch circuit SW5 may connect the second host line HL2 to the second transmission line TL2 if the fifth switch control signal SC<5> is enabled. The sixth switch circuit SW6 may connect the second host line HL2 to a second internal line IL2 if the sixth switch control signal SC<6> is enabled. The seventh switch circuit SW7 may connect the second internal line IL2 to the second input and output (I/O) line IO2 if the seventh switch control signal SC<7> is enabled. The eighth switch circuit SW8 may connect the second input and output (I/O) line IO2 to the first internal transmission line ITL1 if the eighth switch control signal SC<8> is enabled.

The third selection/transmission circuit 352 may include a ninth switch circuit SW9, a tenth switch circuit SW10, an eleventh switch circuit SW11 and a twelfth switch circuit SW12.

The ninth switch circuit SW9 may connect the first transmission line TL1 to the third transmission line TL3 if the ninth switch control signal SC<9> is enabled. The tenth switch circuit SW10 may connect the first transmission line TL1 to a third internal line IL3 if the tenth switch control signal SC<10> is enabled. The eleventh switch circuit SW11 may connect the third internal line IL3 to the third input and output (I/O) line IO3 if the eleventh switch control signal SC<11> is enabled. The twelfth switch circuit SW12 may connect the third input and output (I/O) line IO3 to the second internal transmission line ITL2 if the twelfth switch control signal SC<12> is enabled.

The fourth selection/transmission circuit 362 may include a thirteenth switch circuit SW13, a fourteenth switch circuit SW14, a fifteenth switch circuit SW15 and a sixteenth switch circuit SW16.

The thirteenth switch circuit SW13 may connect the second transmission line TL2 to the fourth transmission line TL4 if the thirteenth switch control signal SC<13> is enabled. The fourteenth switch circuit SW14 may connect the second transmission line TL2 to a fourth internal line IL4 if the fourteenth switch control signal SC<14> is enabled. The fifteenth switch circuit SW15 may connect the fourth internal line IL4 to the fourth input and output (I/O) line IO4 if the fifteenth switch control signal SC<15> is enabled. The sixteenth switch circuit SW16 may connect the fourth input and output (I/O) line IO4 to the second internal transmission line ITL2 if the sixteenth switch control signal SC<16> is enabled.

Figure 4:
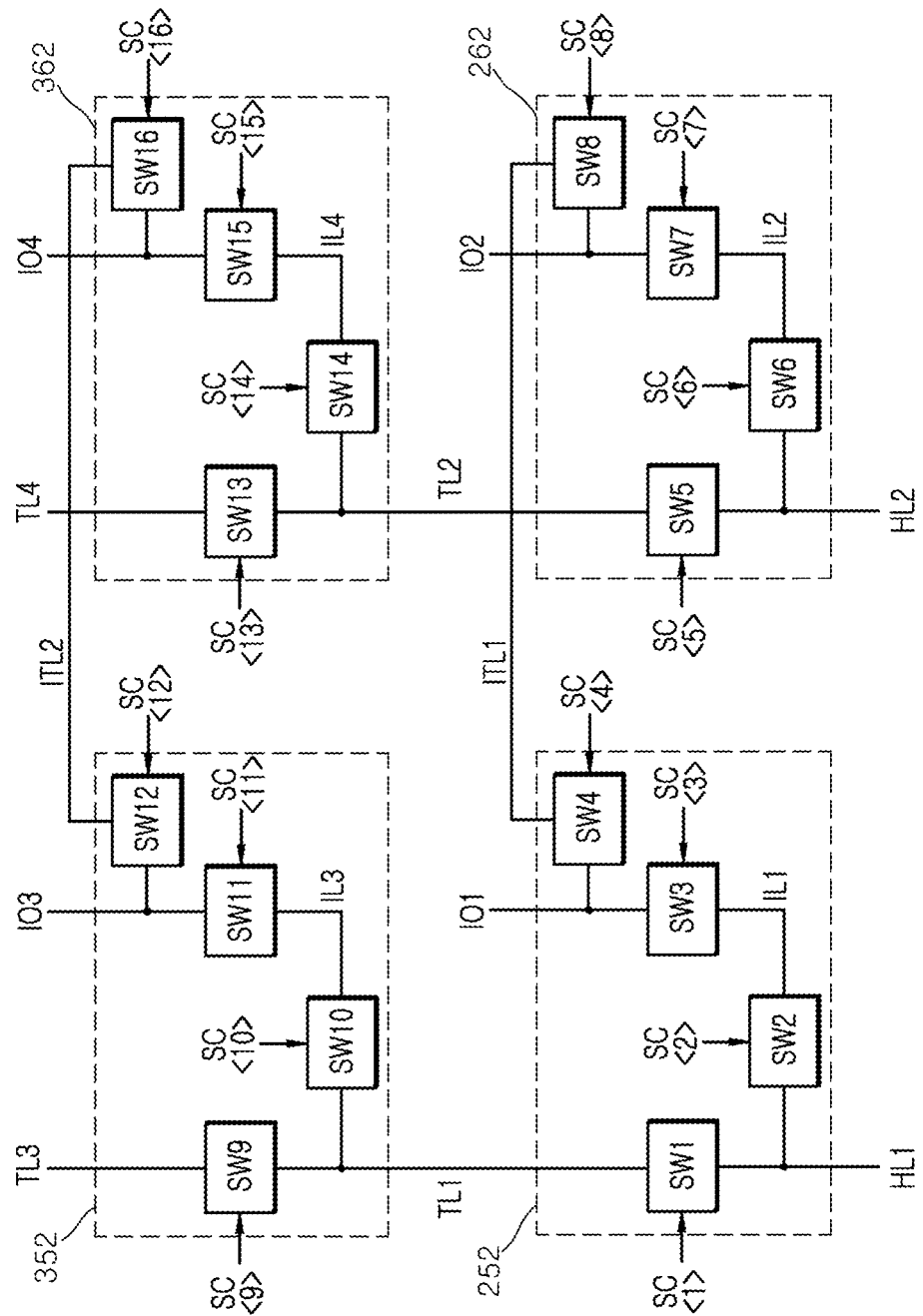
FIG. 4 is a block diagram illustrating configurations of first to fourth selection/transmission circuits illustrated in FIGS. 2 and 3 and illustrating interconnections between input and output (I/O) lines of the first to fourth selection and transmission (selection/transmission) circuits illustrated in FIGS. 2 and 3.
Figure 5:
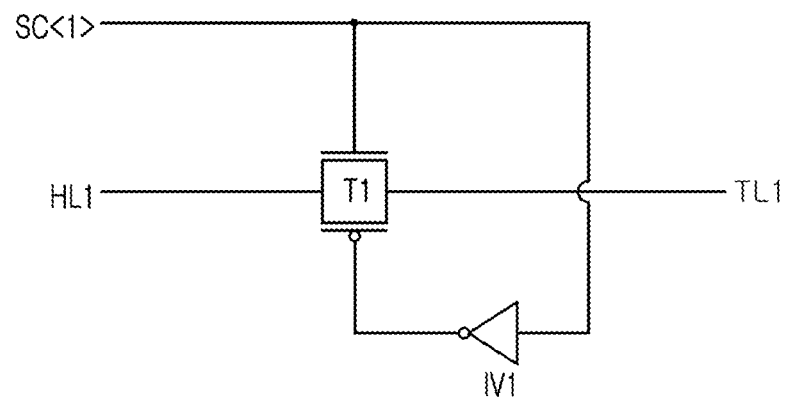
FIG. 5 is a circuit diagram illustrating an example of a first switch circuit included in the first selection/transmission circuit illustrated in FIG. 4.

Referring to FIG. 5, a first switch circuit SW1a corresponding to an example of the first switch circuit SW1 illustrated in FIG. 4 may be configured to include a transfer gate T1 and an inverter IV1.

The transfer gate T1 may be turned on if the first switch control signal SC<1> is enabled to have a logic "high" level. The transfer gate T1 may connect the first host line HL1 to the first transmission line TL1 if the first switch control signal SC<1> is enabled to have a logic "high" level.

Each of the second to sixteenth switch circuits SW2~SW16 illustrated in FIG. 4 may be realized to have substantially the same configuration and function as the first switch circuit SW1a illustrated in FIG. 5 except input and output lines thereof. Thus, descriptions of the second to sixteenth switch circuits SW2~SW16 will be omitted hereinafter.

Figure 6:
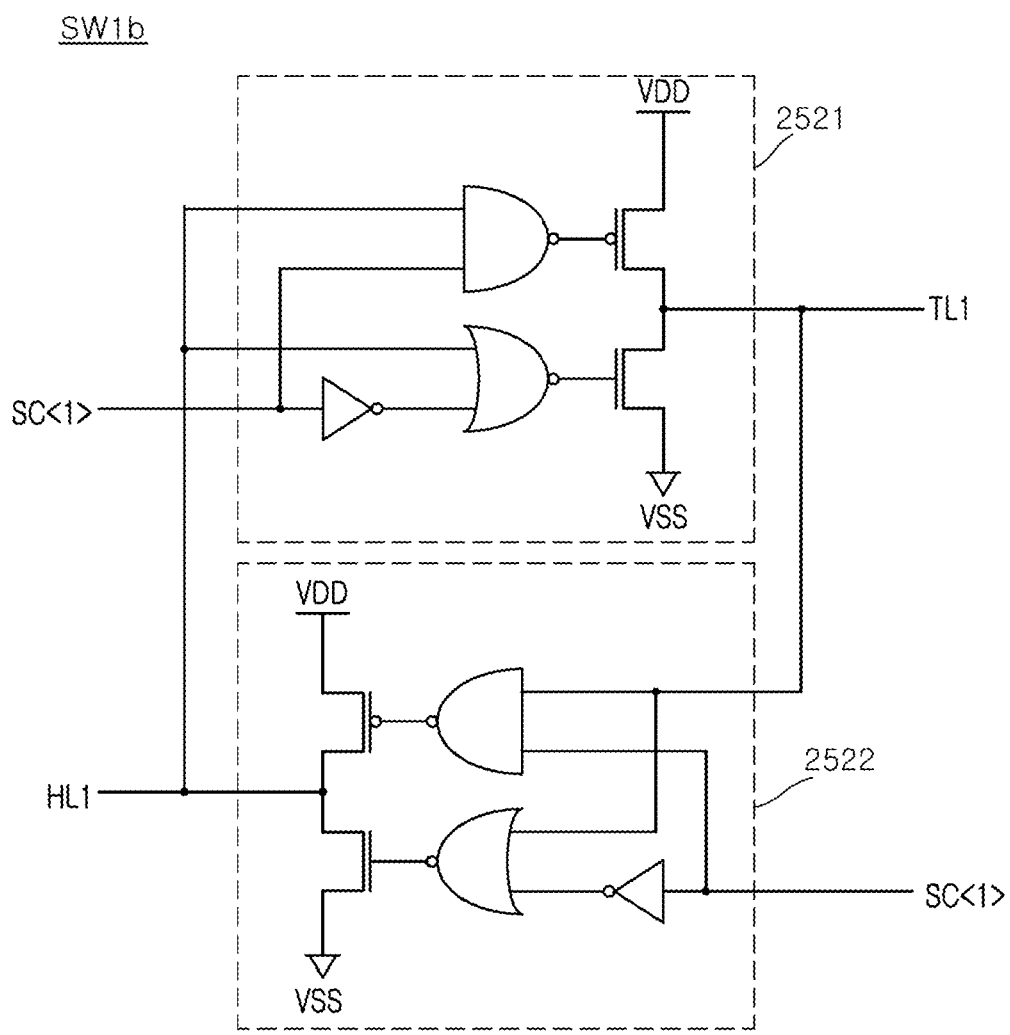
FIG. 6 is a circuit diagram illustrating an example of a first switch circuit included in the first selection/transmission circuit illustrated in FIG. 4.

Referring to FIG. 6, a first switch circuit SW1b corresponding to an example of the first switch circuit SW1 illustrated in FIG. 4 may be configured to include a first transfer circuit 2521 and a second transfer circuit 2522.

The first transfer circuit 2521 may buffer a signal on the first host line HL1 to output the buffered signal to the first transmission line TL1 if the first switch control signal SC<1> is enabled to have a logic "high" level.

The second transfer circuit 2522 may buffer a signal on the first transmission line TL1 to output the buffered signal to the first host line HL1 if the first switch control signal SC<1> is enabled to have a logic "high" level.

Each of the second to sixteenth switch circuits SW2~SW16 illustrated in FIG. 4 may be realized to have substantially the same configuration and function as the first switch circuit SW1b illustrated in FIG. 6 except input and output lines thereof. Thus, descriptions of the second to sixteenth switch circuits SW2~SW16 will be omitted hereinafter.

Various logic levels of the first to eighth switch control signals SC<1:8> according to the first to third set modes will be described hereinafter with reference to FIG. 7.

In the first set mode, the first to eighth switch control signals SC<1:8> may be generated to have a logic "high(H)" level, a logic "high(H)" level, a logic "high(H)" level, a logic "low(L)" level, a logic "high(H)" level, a logic "high (H)" level, a logic "high(H)" level and a logic "low(L)" level, respectively.

In the second set mode, the first to eighth switch control signals SC<1:8> may be generated to have a logic "low(L)" level, a logic "high(H)" level, a logic "high(H)" level, a logic "high(H)" level, a logic "high(H)" level, a logic "low(L)" level, a logic "low(L)" level and a logic "high(H)" level, respectively.

In the third set mode, the first switch control signal SC<1> may be generated to sequentially have a logic "low(L)" level and a logic "low(L)" level, the second switch control signal SC<2> may be generated to sequentially have a logic "high(H)" level and a logic "high(H)" level, the third switch control signal SC<3> may be generated to sequentially have a logic "high(H)" level and a logic "high(H)" level, the fourth switch control signal SC<4> may be generated to sequentially have a logic "low(L)" level and a logic "high (H)" level, the fifth switch control signal SC<5> may be generated to sequentially have a logic "low(L)" level and a logic "high(H)" level, the sixth switch control signal SC<6> may be generated to sequentially have a logic "high(H)" level and a logic "low(L)" level, the seventh switch control signal SC<7> may be generated to sequentially have a logic "high(H)" level and a logic "low(L)" level, and the eighth switch control signal SC<8> may be generated to sequentially have a logic "low(L)" level and a logic "high(H)" level.

Various logic levels of the ninth to sixteenth switch control signals SC<9:16> according to the first to third set modes will be described hereinafter with reference to FIG. 8.

In the first set mode, the ninth to sixteenth switch control signals SC<9:16> may be generated to have a logic "high (H)" level, a logic "high(H)" level, a logic "high(H)" level, a logic "low(L)" level, a logic "high(H)" level, a logic "high(H)" level, a logic "high(H)" level and a logic "low (L)" level, respectively.

In the second set mode, the ninth to sixteenth switch control signals SC<9:16> may be generated to have a logic "low(L)" level, a logic "low(L)" level, a logic "low(L)" level, a logic "high(H)" level, a logic "low(L)" level, a logic "high(H)" level, a logic "high(H)" level and a logic "high (H)" level, respectively.

In the third set mode, the ninth switch control signal SC<9> may be generated to sequentially have a logic "low(L)" level and a logic "low(L)" level, the tenth switch control signal SC<10> may be generated to sequentially have a logic "low(L)" level and a logic "low(L)" level, the eleventh switch control signal SC<11> may be generated to sequentially have a logic "low(L)" level and a logic "low (L)" level, the twelfth switch control signal SC<12> may be generated to sequentially have a logic "high(H)" level and a logic "high(H)" level, the thirteenth switch control signal SC<13> may be generated to sequentially have a logic "low(L)" level and a logic "low(L)" level, the fourteenth switch control signal SC<14> may be generated to sequentially have a logic "low(L)" level and a logic "high(H)" level, the fifteenth switch control signal SC<15> may be generated to sequentially have a logic "high(H)" level and a logic "high(H)" level, and the sixteenth switch control signal SC<16> may be generated to sequentially have a logic "high(H)" level and a logic "high(H)" level.

Various operations of the semiconductor module having an aforementioned configuration will be described hereinafter with reference to FIGS. 9 to 12 in conjunction with connections between the first to fourth channels 252, 262, 352 and 362 in each of the first to third set modes.

Figure 9:
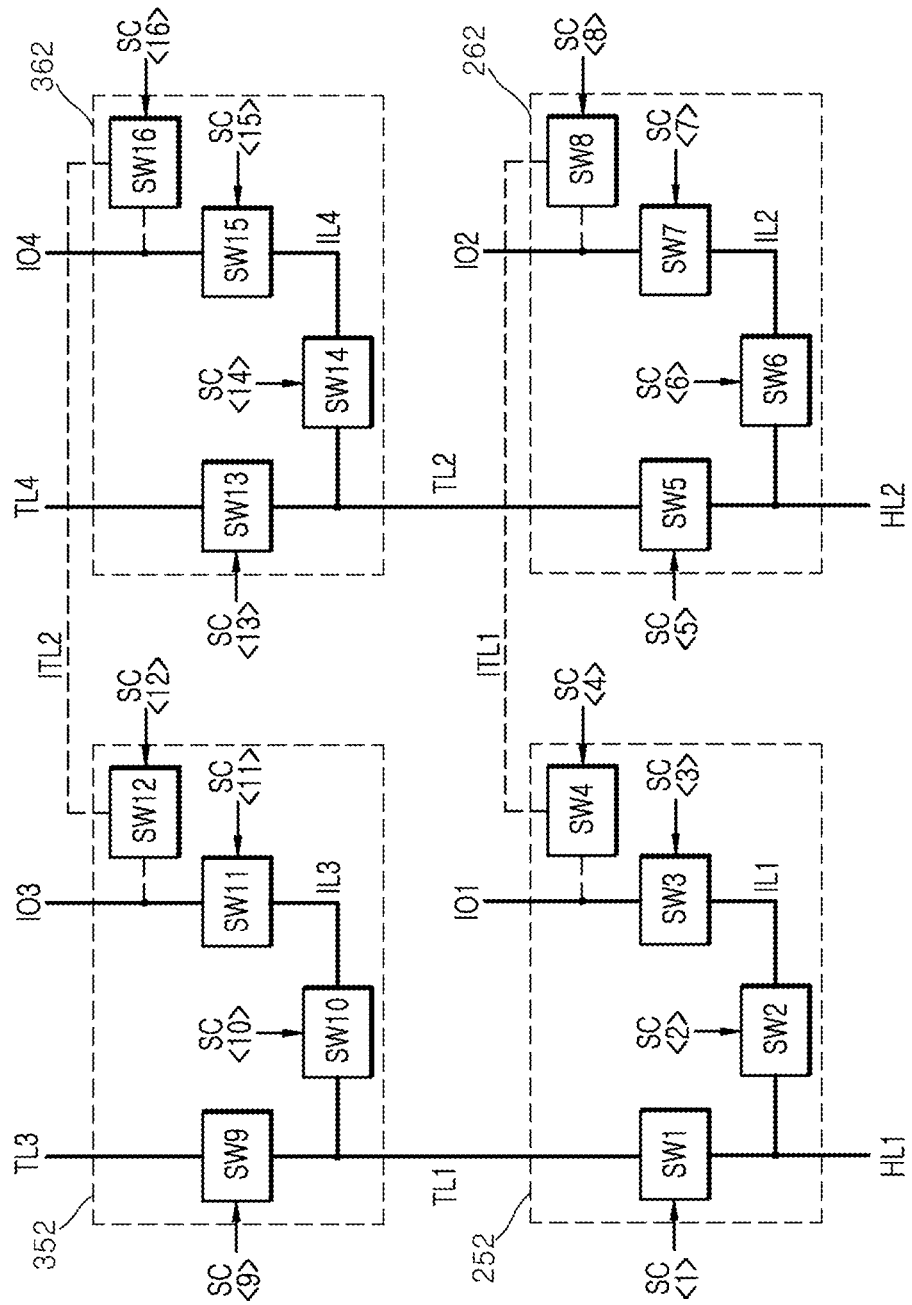
FIGS. 9 to 12 are block diagrams illustrating various configurations of first to fourth selection/transmission circuits illustrated in FIGS. 2 and 3 and illustrating various interconnections between input and output (I/O) lines of the first to fourth selection/transmission circuits illustrated in FIGS. 2 and 3, according to set modes used in an embodiment of the present disclosure.

First, connections between the first to fourth channels 252, 262, 352 and 362 in the first set mode will be described hereinafter with reference to FIG. 9.

The first selection/transmission circuit 252 of the first channel 25 may turn on the first, second and third switch circuits SW1, SW2 and SW3 in response to the first to fourth switch control signals SC<1:4> having a logic level combination of 'H,H,H,L'. In the first to fourth switch control signals SC<1:4>, the logic level combination of 'H,H,H,L' means that the first switch control signal SC<1> has a logic "high" level, the second switch control signal SC<2> has a logic "high" level, the third switch control signal SC<3> has a logic "high" level, and the fourth switch control signal SC<4> has a logic "low" level. That is, the first channel 25 may connect the first host line HL1 to the first transmission line TL1 and the first input and output (I/O) line IO1. Accordingly, the first host line HL1, the first transmission line TL1, the first internal line IL1, and the first input and output (I/O) line IO1 illustrated in solid lines are electrically connected to each other, and the first internal transmission line ITL1 illustrated in a dotted line is disconnected from the first input and output (I/O) line IO1.

The second selection/transmission circuit 262 of the second channel 26 may turn on the fifth, sixth and seventh switch circuits SW5, SW6 and SW7 in response to the fifth to eighth switch control signals SC<5:8> having a logic level combination of 'H,H,H,L'. In the fifth to eighth switch control signals SC<5:8>, the logic level combination of 'H,H,H,L' means that the fifth switch control signal SC<5> has a logic "high" level, the sixth switch control signal SC<6> has a logic "high" level, the seventh switch control signal SC<7> has a logic "high" level, and the eighth switch control signal SC<8> has a logic "low" level. That is, the second channel 26 may connect the second host line HL2 to the second transmission line TL2 and the second input and output (I/O) line IO2. Accordingly, the second host line HL2, the second transmission line TL2, the second internal line IL2, and the second input and output (I/O) line IO2 illustrated in solid lines are electrically connected to each other, and the first internal transmission line ITL1 illustrated in a dotted line is disconnected from the second input and output (I/O) line IO2.

The third selection/transmission circuit 352 of the third channel 35 may turn on the ninth, tenth and eleventh switch circuits SW9, SW10 and SW11 in response to the ninth to twelfth switch control signals SC<9:12> having a logic level combination of 'H,H,H,L'. In the ninth to twelfth switch control signals SC<9:12>, the logic level combination of 'H,H,H,L' means that the ninth switch control signal SC<9> has a logic "high" level, the tenth switch control signal SC<10> has a logic "high" level, the eleventh switch control signal SC<11> has a logic "high" level, and the twelfth switch control signal SC<12> has a logic "low" level. That is, the third channel 35 may connect the first transmission line TL1 to the third transmission line TL3 and the third input and output (I/O) line IO3. Accordingly, the first transmission line TL1, the third transmission line TL3, the third internal line IL3, and the third input and output (I/O) line IO3 illustrated in solid lines are electrically connected to each other, and the second internal transmission line ITL2 illustrated in a dotted line is disconnected from the third input and output (I/O) line IO3.

The fourth selection/transmission circuit 362 of the fourth channel 36 may turn on the thirteenth, fourteenth and fifteenth switch circuits SW13, SW14 and SW15 in response to the thirteenth to sixteenth switch control signals SC<13:16> having a logic level combination of 'H,H,H,L'. In the thirteenth to sixteenth switch control signals SC<13:16>, the logic level combination of 'H,H,H,L' means that the thirteenth switch control signal SC<13> has a logic "high" level, the fourteenth switch control signal SC<14> has a logic "high" level, the fifteenth switch control signal SC<15> has a logic "high" level, and the sixteenth switch control signal SC<16> has a logic "low" level. That is, the fourth channel 36 may connect the second transmission line TL2 to the fourth transmission line TL4 and the fourth input and output (I/O) line IO4. Accordingly, the second transmission line TL2, the fourth transmission line TL4, the fourth internal line IL4, and the fourth input and output (I/O) line IO4 illustrated in solid lines are electrically connected to each other, and the second internal transmission line ITL2 illustrated in a dotted line is disconnected from the fourth input and output (I/O) line IO4.

As described above, in the first set mode, the semiconductor module may connect the first host line HL1 to the first and third channels 25 and 35 and may connect the second host line HL2 to the second and fourth channels 26 and 36, in order to receive or output signals. In such a case, the host 10 (see FIG. 1) may be simultaneously connected to the first and second semiconductor devices 20 and 30 through the first host line HL1 and may be simultaneously connected to the first and second semiconductor devices 20 and 30 through the second host line HL2. Accordingly, the semiconductor module may be realized to operate with a multi-drop scheme.

Figure 10:
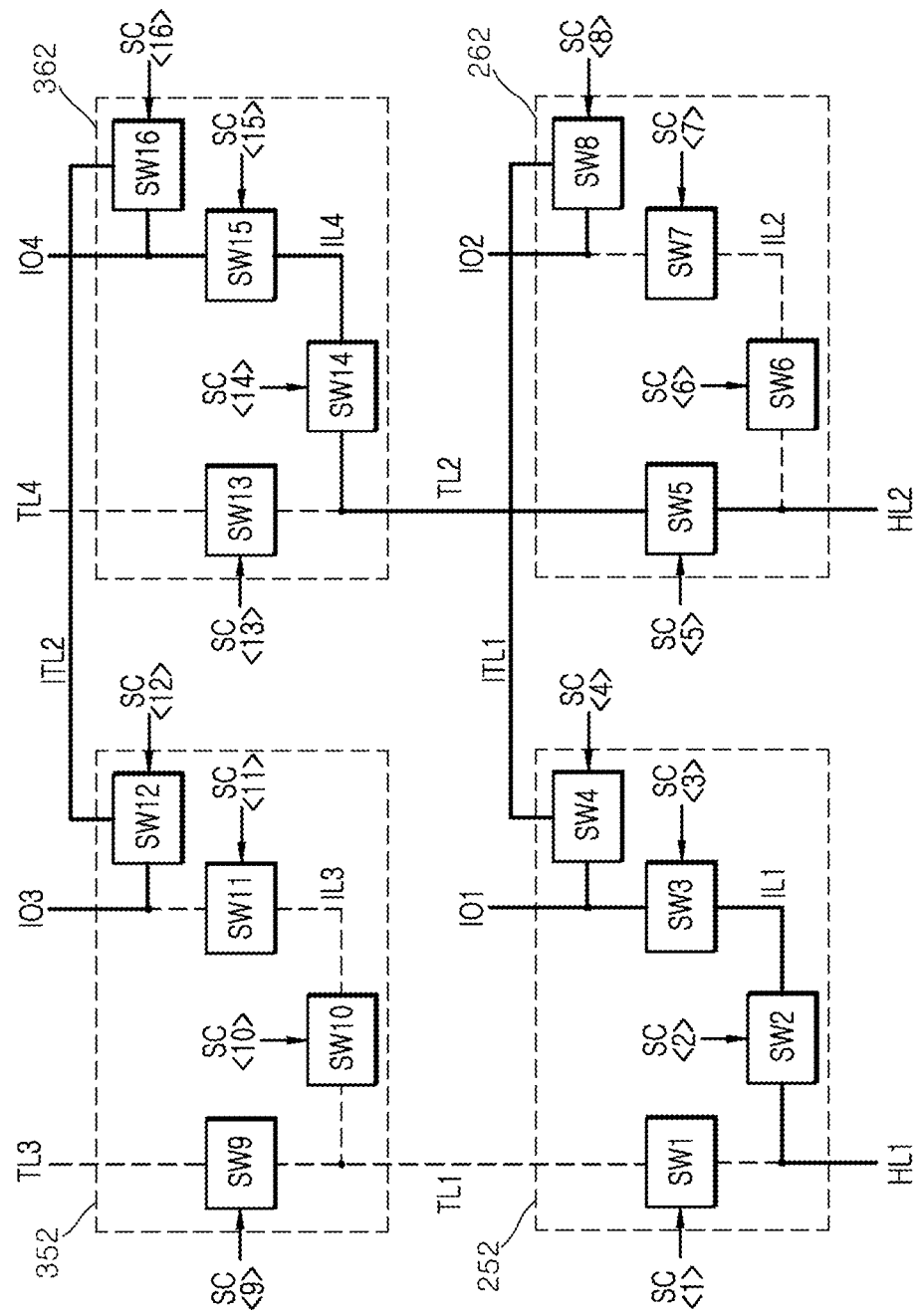

Next, connections between the first to fourth channels 252, 262, 352 and 362 in the second set mode will be described hereinafter with reference to FIG. 10.

The first selection/transmission circuit 252 of the first channel 25 may turn on the second, third and fourth switch circuits SW2, SW3 and SW4 in response to the first to fourth switch control signals SC<1:4> having a logic level combination of 'L,H,H,H'. In the first to fourth switch control signals SC<1:4>, the logic level combination of 'L,H,H,H' means that the first switch control signal SC<1> has a logic "low" level, the second switch control signal SC<2> has a logic "high" level, the third switch control signal SC<3> has a logic "high" level, and the fourth switch control signal SC<4> has a logic "high" level. That is, the first channel 25 may connect the first host line HL1 to the first internal line IL1 and the first input and output (I/O) line IO1, and may connect the first input and output (I/O) line IO1 to the first internal transmission line ITL1. Accordingly, the first host line HL1, the first internal line ILL the first input and output (I/O) line IO1, and the first internal transmission line ITL1 illustrated in solid lines are electrically connected to each other, and the first transmission line TL1 illustrated in a dotted line is disconnected from the first host line HL1.

The second selection/transmission circuit 262 of the second channel 26 may turn on the fifth and eighth switch circuits SW5 and SW8 in response to the fifth to eighth switch control signals SC<5:8> having a logic level combination of 'H,L,L,H'. In the fifth to eighth switch control signals SC<5:8>, the logic level combination of 'H,L,L,H' means that the fifth switch control signal SC<5> has a logic "high" level, the sixth switch control signal SC<6> has a logic "low" level, the seventh switch control signal SC<7> has a logic "low" level, and the eighth switch control signal SC<8> has a logic "high" level. That is, the second channel 26 may connect the second host line HL2 to the second transmission line TL2 and may connect the second input and output (I/O) line IO2 to the first internal transmission line ITL1. Accordingly, the second host line HL2 and the second transmission line TL2 illustrated in solid lines are electrically connected to each other, and the first internal transmission line ITL1 and the second input and output (I/O) line IO2 illustrated in solid lines are electrically connected to each other. The second input and output (I/O) line IO2 is disconnected from the second host line HL2 by the second internal line IL2 illustrated in a dotted line.

The third selection/transmission circuit 352 of the third channel 35 may turn on the twelfth switch circuit SW12 in response to the ninth to twelfth switch control signals SC<9:12> having a logic level combination of 'L,L,L,H'. In the ninth to twelfth switch control signals SC<9:12>, the logic level combination of 'L,L,L,H' means that the ninth switch control signal SC<9> has a logic "low" level, the tenth switch control signal SC<10> has a logic "low" level, the eleventh switch control signal SC<11> has a logic "low" level, and the twelfth switch control signal SC<12> has a logic "high" level. That is, the third channel 35 may connect the second internal transmission line ITL2 to the third input and output (I/O) line IO3. Accordingly, the second internal transmission line ITL2 and the third input and output (I/O) line IO3 illustrated in solid lines are electrically connected to each other. The first transmission line TL1 and the third transmission line TL3 illustrated in dotted lines are disconnected from each other, and the third input and output (I/O) line IO3 is disconnected from the first transmission line TL1 by the third internal line IL3 illustrated in a dotted line.

The fourth selection/transmission circuit 362 of the fourth channel 36 may turn on the fourteenth, fifteenth and sixteenth switch circuits SW14, SW15 and SW16 in response to the thirteenth to sixteenth switch control signals SC<13:16> having a logic level combination of 'L,H,H,H'. In the thirteenth to sixteenth switch control signals SC<13:16>, the logic level combination of 'L,H,H,H' means that the thirteenth switch control signal SC<13> has a logic "low" level, the fourteenth switch control signal SC<14> has a logic "high" level, the fifteenth switch control signal SC<15> has a logic "high" level, and the sixteenth switch control signal SC<16> has a logic "high" level. That is, the fourth channel 36 may connect the second transmission line TL2 to the fourth internal line IL4 and the fourth input and output (I/O) line IO4 and the second internal transmission line ITL2. Accordingly, the second transmission line TL2, the fourth internal lie IL4, the fourth input and output (I/O) line IO4, and the second internal transmission line ITL2 illustrated in solid lines are electrically connected to each other, and the fourth transmission line TL4 illustrated in a dotted line is disconnected from the second transmission line TL2.

As described above, in the second set mode, the semiconductor module may connect the first host line HL1 to the first and second channels 25 and 26 and may connect the second host line HL2 to the third and fourth channels 35 and 36, in order to receive or output signals. In such a case, the host 10 (see FIG. 1) may be connected to the first semiconductor device 20 through the first host line HL1 and may be connected to the second semiconductor device 30 through the second host line HL2. Accordingly, the semiconductor module may be realized to operate with a point-to-point scheme.

Figure 11:
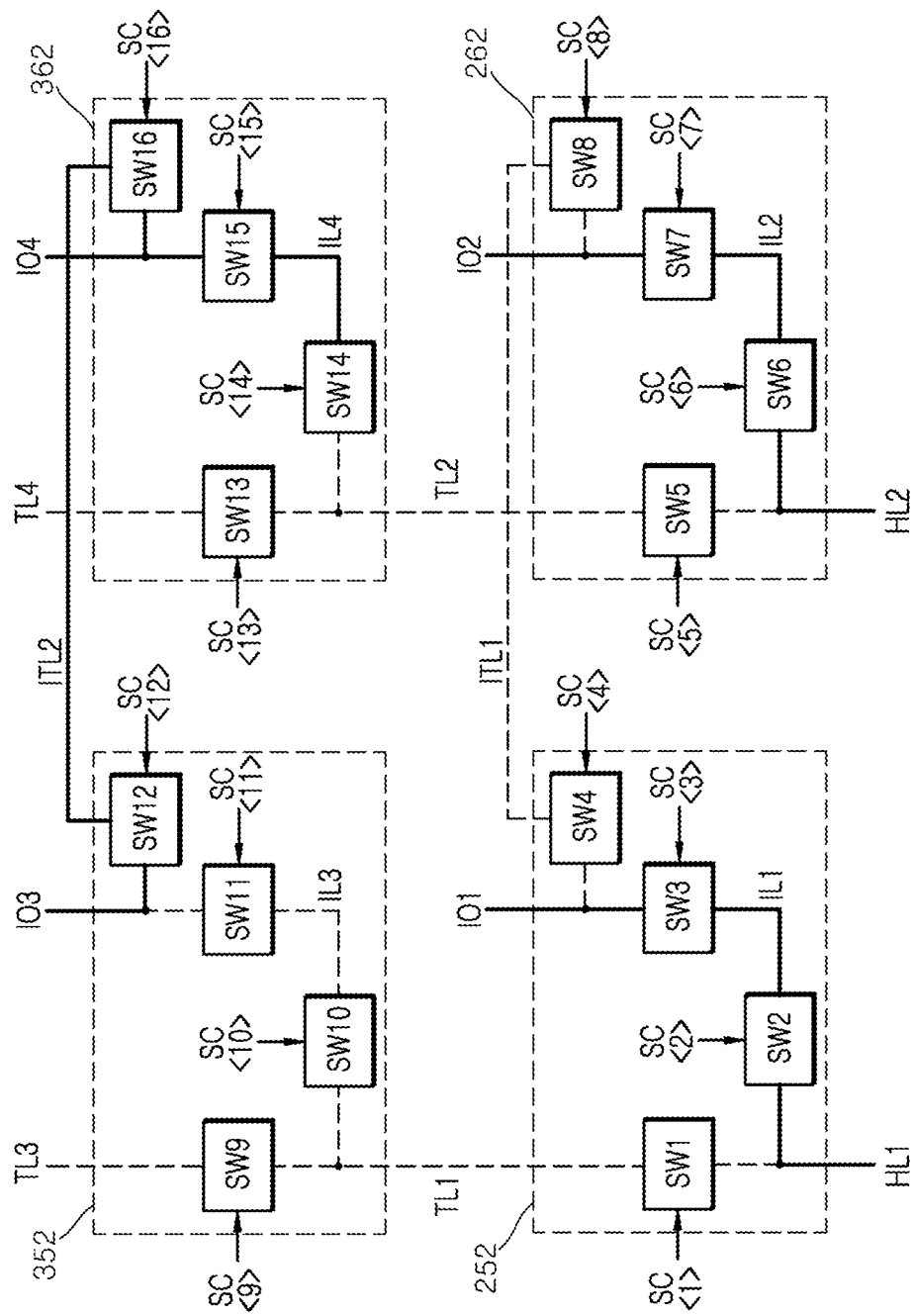
Figure 12:
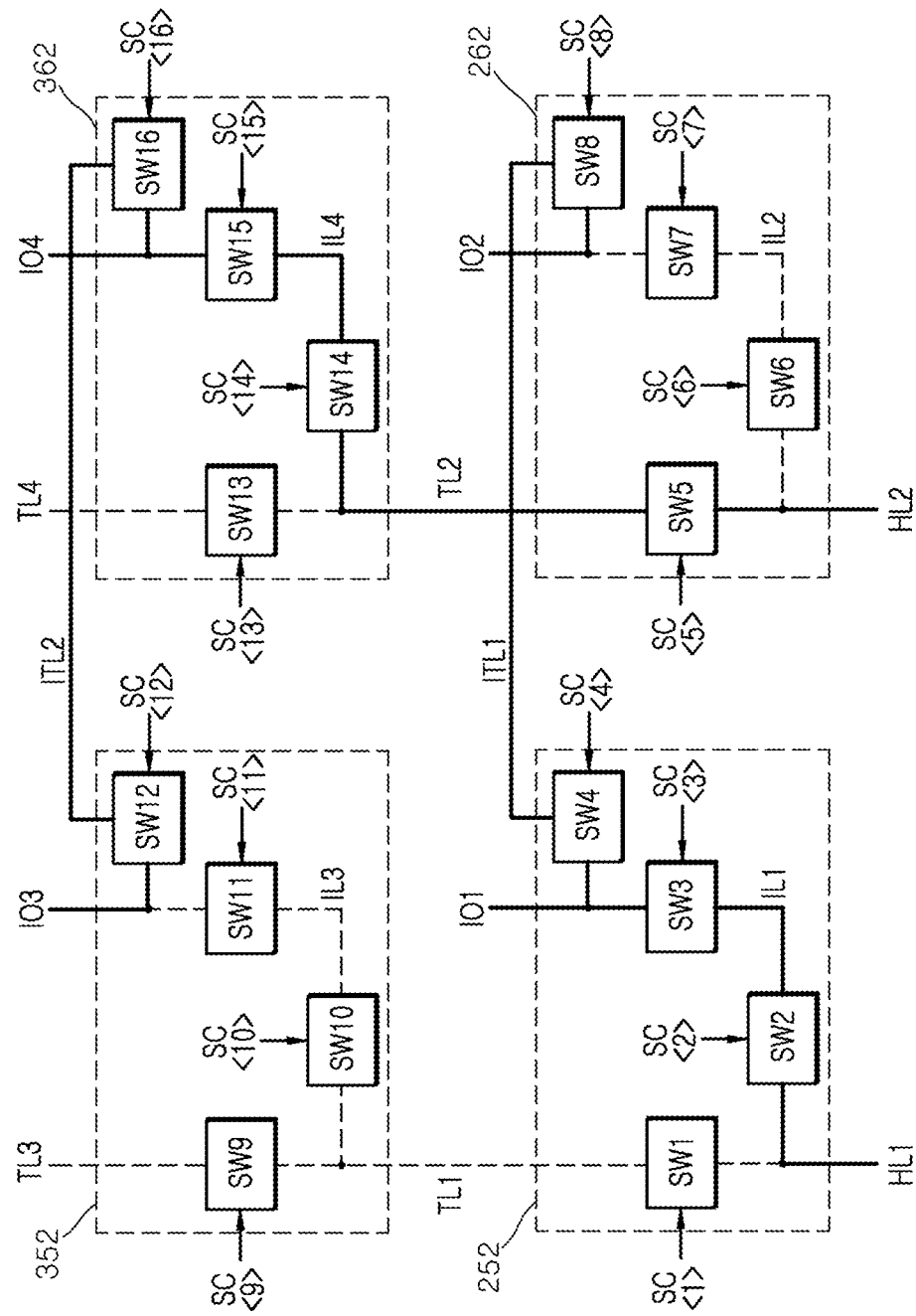

Next, connections between the first to fourth channels 252, 262, 352 and 362 in the third set mode will be described hereinafter with reference to FIGS. 11 and 12. The third set mode may be set to correspond to a case that the first semiconductor device 20 is realized using a volatile memory device to operate at a relatively high speed and the second semiconductor device 30 is realized using a nonvolatile memory device to operate at a relatively low speed.

The first selection/transmission circuit 252 of the first channel 25 may turn on the second and third switch circuits SW2 and SW3 in response to the first to fourth switch control signals SC<1:4> having a logic level combination of 'L,H,H,L'. In the first to fourth switch control signals SC<1:4>, the logic level combination of 'L,H,H,L' means that the first switch control signal SC<1> has a logic "low" level, the second switch control signal SC<2> has a logic "high" level, the third switch control signal SC<3> has a logic "high" level, and the fourth switch control signal SC<4> has a logic "low" level. That is, the first channel 25 may connect the first host line HL1 to the first internal line IL1 and the first input and output (I/O) line IO1. Accordingly, the first host line HL1, the first internal line ILL and the first input and output (I/O) line IO1 illustrated in solid lines are electrically connected to each other. The first transmission line TL1 illustrated in a dotted line is disconnected from the first host line HL1, and the first internal transmission line ITL1 illustrated in a dotted line is disconnected from the first input and output (I/O) line IO1.

The second selection/transmission circuit 262 of the second channel 26 may turn on the sixth and seventh switch circuits SW6 and SW7 in response to the fifth to eighth switch control signals SC<5:8> having a logic level combination of 'L,H,H,L'. In the fifth to eighth switch control signals SC<5:8>, the logic level combination of 'L,H,H,L' means that the fifth switch control signal SC<5> has a logic "low" level, the sixth switch control signal SC<6> has a logic "high" level, the seventh switch control signal SC<7> has a logic "high" level, and the eighth switch control signal SC<8> has a logic "low" level. That is, the second channel 26 may connect the second host line HL2 to the second internal line IL2 and the second input and output (I/O) line IO2. Accordingly, the second host line HL2, the second internal line IL2, and the second input and output (I/O) line IO2 illustrated in solid lines are electrically connected to each other. The second transmission line TL2 illustrated in a dotted line is disconnected from the second host line HL2, and the first internal transmission line ITL1 illustrated in a dotted line is disconnected from the second input and output (I/O) line IO2.

The third selection/transmission circuit 352 of the third channel 35 may turn on the twelfth switch circuit SW12 in response to the ninth to twelfth switch control signals SC<9:12> having a logic level combination of 'L,L,L,H'. In the ninth to twelfth switch control signals SC<9:12>, the logic level combination of 'L,L,L,H' means that the ninth switch control signal SC<9> has a logic "low" level, the tenth switch control signal SC<10> has a logic "low" level, the eleventh switch control signal SC<11> has a logic "low" level, and the twelfth switch control signal SC<12> has a logic "high" level. That is, the third channel 35 may connect the second internal transmission line ITL2 to the third input and output (I/O) line IO3. Accordingly, the second internal transmission line ITL2 and the third input and output (I/O) line IO3 illustrated in solid lines are electrically connected to each other. The first transmission line TL1 and the third transmission line TL3 illustrated in dotted lines are disconnected from each other, and the third input and output (I/O) line IO3 is disconnected from the first transmission line TL1 by the third internal line IL3 illustrated in a dotted line.

The fourth selection/transmission circuit 362 of the fourth channel 36 may turn on the fifteenth and sixteenth switch circuits SW15 and SW16 in response to the thirteenth to sixteenth switch control signals SC<13:16> having a logic level combination of 'L,L,H,H'. In the thirteenth to sixteenth switch control signals SC<13:16>, the logic level combination of 'L,L,H,H' means that the thirteenth switch control signal SC<13> has a logic "low" level, the fourteenth switch control signal SC<14> has a logic "low" level, the fifteenth switch control signal SC<15> has a logic "high" level, and the sixteenth switch control signal SC<16> has a logic "high" level. That is, the fourth channel 36 may connect the second internal transmission line ITL2 to the fourth input and output (I/O) line IO4. Accordingly, the second internal transmission line ITL2 and the fourth input and output (I/O) line IO4 illustrated in solid lines are electrically connected to each other, and the second and fourth transmission lines TL2 and TL4 illustrated in dotted lines are disconnected from the fourth input and output (I/O) line IO4.

Subsequently, referring to FIG. 12, the first selection/transmission circuit 252 of the first channel 25 may turn on the second, third and fourth switch circuits SW2, SW3 and SW4 in response to the first to fourth switch control signals SC<1:4> having a logic level combination of 'L,H,H,H'. In the first to fourth switch control signals SC<1:4>, the logic level combination of 'L,H,H,H' means that the first switch control signal SC<1> has a logic "low" level, the second switch control signal SC<2> has a logic "high" level, the third switch control signal SC<3> has a logic "high" level, and the fourth switch control signal SC<4> has a logic "high" level. That is, the first channel 25 may connect the first host line HL1 to the first internal line IL1 and the first input and output (I/O) line IO1, and may connect the first input and output (I/O) line IO1 to the first internal transmission line ITL1. Accordingly, the first host line HL1, the first internal line IL1, the first input and output (I/O) line IO1 and the first internal transmission line ITL1 illustrated in solid lines are electrically connected to each other. The first transmission line TL1 illustrated in a dotted line is disconnected from the first host line HL1.

The second selection/transmission circuit 262 of the second channel 26 may turn on the fifth and eighth switch circuits SW5 and SW8 in response to the fifth to eighth switch control signals SC<5:8> having a logic level combination of 'H,L,L,H'. In the fifth to eighth switch control signals SC<5:8>, the logic level combination of 'H,L,L,H' means that the fifth switch control signal SC<5> has a logic "high" level, the sixth switch control signal SC<6> has a logic "low" level, the seventh switch control signal SC<7> has a logic "low" level, and the eighth switch control signal SC<8> has a logic "high" level. That is, the second channel 26 may connect the second host line HL2 to the second transmission line TL2 and may connect the first internal transmission line ITL1 to the second input and output (I/O) line IO2. Accordingly, the second host line HL2 and the second transmission line TL2 illustrated in solid lines are electrically connected to each other, and the first internal transmission line ITL1 and the second input and output (I/O) line IO2 illustrated in solid lines are electrically connected to each other. The second input and output (I/O) line IO2 is disconnected from the second host line HL2 by the second internal line IL2 illustrated in a dotted line.

The third selection/transmission circuit 352 of the third channel 35 may turn on the twelfth switch circuit SW12 in response to the ninth to twelfth switch control signals SC<9:12> having a logic level combination of 'L,L,L,H'. In the ninth to twelfth switch control signals SC<9:12>, the logic level combination of 'L,L,L,H' means that the ninth switch control signal SC<9> has a logic "low" level, the tenth switch control signal SC<10> has a logic "low" level, the eleventh switch control signal SC<11> has a logic "low" level, and the twelfth switch control signal SC<12> has a logic "high" level. That is, the third channel 35 may connect the second internal transmission line ITL2 to the third input and output (I/O) line IO3. Accordingly, the second internal transmission line ITL2 and the third input and output (I/O) line IO3 illustrated in solid lines are electrically connected to each other. The first transmission line TL1 and the third transmission line TL3 illustrated in dotted lines are disconnected from each other, and the third input and output (I/O) line IO3 is disconnected from the first transmission line TL1 by the third internal line IL3 illustrated in a dotted line.

The fourth selection/transmission circuit 362 of the fourth channel 36 may turn on the fourteenth, fifteenth and sixteenth switch circuits SW14, SW15 and SW16 in response to the thirteenth to sixteenth switch control signals SC<13:16> having a logic level combination of 'L,H,H,H'. In the thirteenth to sixteenth switch control signals SC<13:16>, the logic level combination of 'L,H,H,H' means that the thirteenth switch control signal SC<13> has a logic "low" level, the fourteenth switch control signal SC<14> has a logic "high" level, the fifteenth switch control signal SC<15> has a logic "high" level, and the sixteenth switch control signal SC<16> has a logic "high" level. That is, the fourth channel 36 may connect the second transmission line TL2 to the fourth internal line IL4 and fourth input and output (I/O) line IO4, and may connect the fourth input and output (I/O) line IO4 to the second internal transmission line ITL2. Accordingly, the second internal transmission line ITL2, the fourth input and output (I/O) line IO4, the fourth internal line IL4, and the second transmission line TL2 illustrated in solid lines are electrically connected to each other, and the fourth transmission line TL4 illustrated in a dotted line is disconnected from the second transmission line TL2.

As described above, in the third set mode, the semiconductor module may connect the first host line HL1 to the first channel 25 and may connect the second host line HL2 to the second channel 26 in order to receive or output signals, and thereafter, the semiconductor module may connect the first host line HL1 to the first and second channels 25 and 26 and may connect the second host line HL2 to the third and fourth channels 35 and 36 in order to receive or output signals.

In the third set mode, the semiconductor module may be realized to receive or output the signals through the first and second channels 25 and 26 of the first semiconductor device 20 (e.g., a volatile memory device) operating at a relatively high speed, and thereafter, the semiconductor module may be realized to receive or output the signals through the third and fourth channels 35 and 36 of the second semiconductor device 30 (e.g., a nonvolatile memory device) operating at a relatively low speed. Accordingly, the I/O operation speed of the semiconductor module may be improved since the semiconductor module receives or outputs the signals through channels of a semiconductor device operating at a relatively low speed after receiving or outputting the signals through channels of another semiconductor device operating at a relatively high speed.

In such a case, since the host 10 is connected to the first channel 25 of the first semiconductor device 20 through the first host line HL1 and is connected to the second channel 26 of the first semiconductor device 20 through the second host line HL2, the semiconductor module may be realized to operate with a point-to-point scheme. Thereafter, since the host 10 is connected to the first and second channels 25 and 26 of the first semiconductor device 20 through the first host line HL1 and is connected to the third and fourth channels 35 and 36 of the second semiconductor device 30 through the second host line HL2, the semiconductor module may be realized to operate with a multi-drop scheme.

As described above, a semiconductor module according to an embodiment may control connections between channels included in a plurality of semiconductor devices according to a set mode. In addition, the semiconductor module may receive or output the signals through channels of a semiconductor device operating at a relatively low speed after receiving or outputting the signals through channels of another semiconductor device operating at a relatively high speed. Thus, the I/O operation speed of the semiconductor module may be improved.

Figure 13:
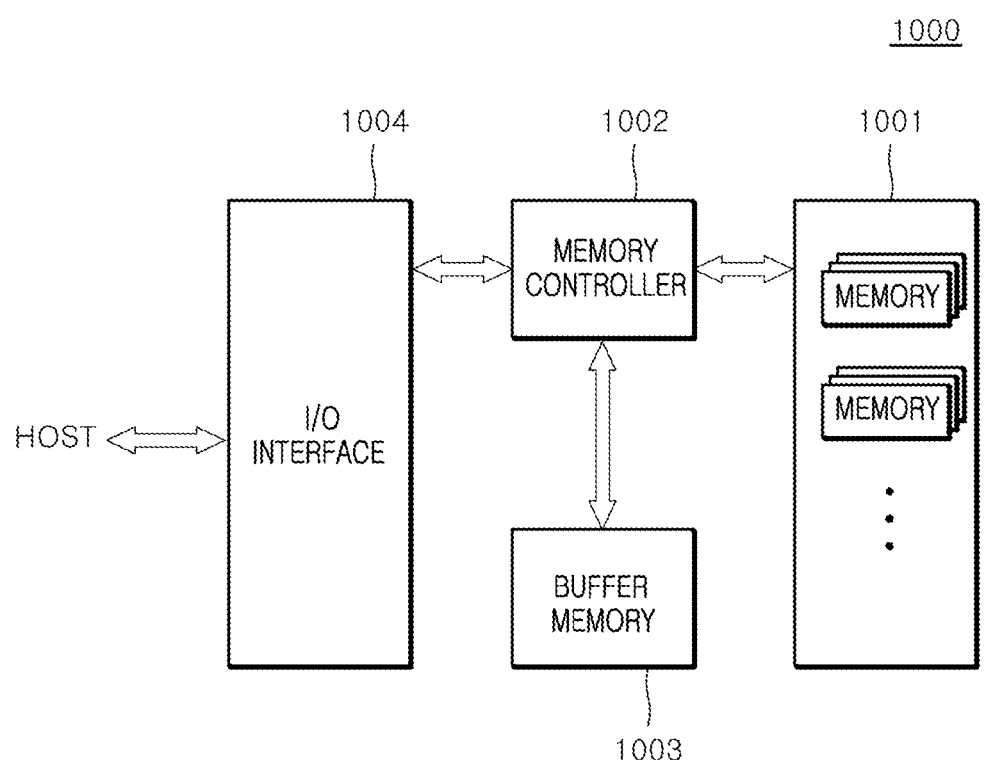
FIG. 13 is a block diagram illustrating a configuration of an electronic system employing a semiconductor module described with reference to FIGS. 1 to 12.

The semiconductor modules described with reference to FIGS. 1 to 12 may be applied to an electronic system that includes a memory system, a graphic system, a computing system, a mobile system, or the like. For example, as illustrated in FIG. 13, an electronic system 1000 according an embodiment may include a data storage circuit 1001, a memory controller 1002, a buffer memory 1003, and an input and output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the first and second semiconductor devices 20 and 30 illustrated in FIG. 1. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 13 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor module comprising:
   a host configured to include a first host line and a second host line;
   a first semiconductor device configured to include a first channel and a second channel; and
   a second semiconductor device configured to include a third channel and a fourth channel,
   wherein the first host line is connected to the first and third channels or to the first and second channels according to a set mode, and
   wherein the second host line is connected to the second and fourth channels or to the third and fourth channels according to the set mode.

2. The semiconductor module of claim 1,
   wherein if the set mode is a first set mode, the first host line is connected to the first and third channels to receive or output a first signal and the second host line is connected to the second and fourth channels to receive or output a second signal.

3. The semiconductor module of claim 1,
   wherein if the set mode is a second set mode, the first host line is connected to the first and second channels to receive or output a first signal and the second host line is connected to the third and fourth channels to receive or output a second signal.

4. The semiconductor module of claim 1, wherein if the set mode is a third set mode, the first host line is connected to the first and second channels to receive or output a first signal and the second host line is connected to the third and fourth channels to receive or output a second signal after the first host line is connected to the first channel to receive or output the first signal and the second host line is connected to the second channel to receive or output the second signal.

5. The semiconductor module of claim 4, wherein the third set mode is set to correspond to a case that an operation speed of the first semiconductor device is faster than an operation speed of the second semiconductor device.

6. The semiconductor module of claim 1, wherein the first semiconductor device includes:
   a first memory circuit configured to receive or output a signal through a first input and output (I/O) line;
   a second memory circuit configured to receive or output a signal through a second input and output (I/O) line;
   the first channel configured to connect the first host line to at least one of a first transmission line and the first input and output (I/O) line to receive or output a first signal, according to the set mode; and
   the second channel configured to connect the second host line to at least one of a second transmission line and the second input and output (I/O) line to receive or output a second signal, according to the set mode, wherein the first and second input and output (I/O) lines are connected to each other through a first internal transmission line according to the set mode.

7. The semiconductor module of claim 6, wherein the first channel includes:

a first switch control circuit configured to generate first to fourth switch control signals according to a first command and a first module information signal; and a first selection and transmission (selection/transmission) circuit configured to control connection between the first host line, the first transmission line and the first input and output (I/O) line as well as connection between the first input and output (I/O) line and the first internal transmission line, in response to the first to fourth switch control signals.

8. The semiconductor module of claim 6, wherein the second channel includes:

a second switch control circuit configured to generate fifth to eighth switch control signals according to a first command and a first module information signal; and a second selection/transmission circuit configured to control connection between the second host line, the second transmission line and the second input and output (I/O) line as well as connection between the second input and output (I/O) line and the first internal transmission line, in response to the fifth to eighth switch control signals.

9. The semiconductor module of claim 1, wherein the second semiconductor device includes:

a third memory circuit configured to receive or output a signal through a third input and output (I/O) line;

a fourth memory circuit configured to receive or output a signal through a fourth input and output (I/O) line;

the third channel configured to connect a first transmission line to at least one of a third transmission line and the third input and output (I/O) line to receive or output a first signal, according to the set mode; and the fourth channel configured to connect a second transmission line to at least one of a fourth transmission line and the fourth input and output (I/O) line to receive or output a second signal, according to the set mode, wherein the third and fourth input and output (I/O) lines are connected to each other through a second internal transmission line according to the set mode.

10. The semiconductor module of claim 9, wherein the third channel includes:

a third switch control circuit configured to generate ninth to twelfth switch control signals according to a second command and a second module information signal; and a third selection/transmission circuit configured to control connection between the first transmission line, a third transmission line and the third input and output (I/O) line as well as connection between the third input and output (I/O) line and the second internal transmission line, in response to the ninth to twelfth switch control signals.

11. The semiconductor module of claim 6, wherein the fourth channel includes:

a fourth switch control circuit configured to generate thirteenth to sixteenth switch control signals according to a second command and a second module information signal; and a fourth selection/transmission circuit configured to control connection between the second transmission line, a fourth transmission line and the fourth input and output (I/O) line as well as connection between the fourth input and output (I/O) line and the second internal transmission line, in response to the thirteenth to sixteenth switch control signals.

12. A semiconductor module comprising:

a host configured to include a first host line and a second host line;

a first semiconductor device configured to include a plurality of channels; and a second semiconductor device configured to include a plurality of channels, wherein if a set mode is a first set mode, the first and second host lines are connected to the plurality of channels included in one semiconductor device having a faster operation speed out of the first and second semiconductor devices to receive or output a signal, and thereafter one of the first and second host lines is connected to the plurality of channels included in the other semiconductor device having a slower operation speed out of the first and second semiconductor devices to receive or output a signal.

13. The semiconductor module of claim 12, wherein if the set mode is a second set mode, the first host line is connected to one of the plurality of channels included in the first semiconductor device and one of the plurality of channels included in the second semiconductor device to receive or output a first signal and the second host line is connected to another one of the plurality of channels included in the first semiconductor device and another one of the plurality of channels included in the second semiconductor device to receive or output a second signal.

14. The semiconductor module of claim 12, wherein if the set mode is a third set mode, the first host line is connected to the plurality of channels included in the first semiconductor device to receive or output a first signal and the second host line is connected to the plurality of channels included in the second semiconductor device to receive or output a second signal.

15. The semiconductor module of claim 12, wherein the first semiconductor device includes:

a first memory circuit configured to receive or output a signal through a first input and output (I/O) line;

a second memory circuit configured to receive or output a signal through a second input and output (I/O) line;

a first channel configured to connect the first host line to at least one of a first transmission line and the first input and output (I/O) line to receive or output a first signal, according to the set mode; and a second channel configured to connect the second host line to at least one of a second transmission line and the second input and output (I/O) line to receive or output a second signal, according to the set mode, wherein the first and second input and output (I/O) lines are connected to each other through a first internal transmission line according to the set mode.

16. The semiconductor module of claim 15, wherein the first channel includes:

a first switch control circuit configured to generate first to fourth switch control signals according to a first command and a first module information signal; and a first selection and transmission (selection/transmission) circuit configured to control connection between the first host line, the first transmission line and the first input and output (I/O) line as well as connection between the first input and output (I/O) line and the first internal transmission line, in response to the first to fourth switch control signals.

17. The semiconductor module of claim 15, wherein the second channel includes:
- a second switch control circuit configured to generate fifth to eighth switch control signals according to a first command and a first module information signal; and
- a second selection/transmission circuit configured to control connection between the second host line, the second transmission line and the second input and output (I/O) line as well as connection between the second input and output (I/O) line and the first internal transmission line, in response to the fifth to eighth switch control signals.

18. The semiconductor module of claim 12, wherein the second semiconductor device includes:
- a third memory circuit configured to receive or output a signal through a third input and output (I/O) line;
- a fourth memory circuit configured to receive or output a signal through a fourth input and output (I/O) line;
- a third channel configured to connect a first transmission line to at least one of a third transmission line and the third input and output (I/O) line to receive or output a first signal, according to the set mode; and
- a fourth channel configured to connect a second transmission line to at least one of a fourth transmission line and the fourth input and output (I/O) line to receive or output a second signal, according to the set mode,
- wherein the third and fourth input and output (I/O) lines are connected to each other through a second internal transmission line according to the set mode.

19. The semiconductor module of claim 18, wherein the third channel includes:
- a third switch control circuit configured to generate ninth to twelfth switch control signals according to a second command and a second module information signal; and
- a third selection/transmission circuit configured to control connection between the first transmission line, a third transmission line and the third input and output (I/O) line as well as connection between the third input and output (I/O) line and the second internal transmission line, in response to the ninth to twelfth switch control signals.

20. The semiconductor module of claim 18, wherein the fourth channel includes:
- a fourth switch control circuit configured to generate thirteenth to sixteenth switch control signals according to a second command and a second module information signal; and
- a fourth selection/transmission circuit configured to control connection between the second transmission line, a fourth transmission line and the fourth input and output (I/O) line as well as connection between the fourth input and output (I/O) line and the second internal transmission line, in response to the thirteenth to sixteenth switch control signals.

* * * * *